(12) United States Patent
Shen et al.

(10) Patent No.: US 8,258,007 B2
(45) Date of Patent: Sep. 4, 2012

(54) PACKAGE PROCESS

(75) Inventors: Chi-Chih Shen, Kaohsiung (TW); Jen-Chuan Chen, Taoyuan County (TW); Hui-Shan Chang, Taoyuan County (TW); Wen-Hsiung Chang, Hsinchu (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 155 days.

(21) Appl. No.: 12/817,396

(22) Filed: Jun. 17, 2010

(65) Prior Publication Data
US 2011/0285014 A1    Nov. 24, 2011

(30) Foreign Application Priority Data
May 20, 2010  (TW) .............................. 99116089 A (51) Int. Cl.
*H01L 21/00* (2006.01)
*H01L 21/44* (2006.01)
*H01L 29/40* (2006.01)
(52) U.S. Cl. .......................... 438/109; 438/667; 257/621
(58) Field of Classification Search .................. 438/109, 438/667; 257/621
See application file for complete search history.

(56) References Cited

U.S. PATENT DOCUMENTS

| | | | | |
|---|---|---|---|---|
| 7,843,052 B1* | 11/2010 | Yoo et al. | ...... | 257/686 |
| 7,843,072 B1* | 11/2010 | Park et al. | ...... | 257/774 |
| 2004/0256734 A1* | 12/2004 | Farnworth et al. | ...... | 257/777 |
| 2009/0001602 A1* | 1/2009 | Chung | ...... | 257/777 |
| 2010/0102446 A1* | 4/2010 | Katsurayama et al. | ...... | 257/738 |
| 2010/0261311 A1* | 10/2010 | Tsuji | ...... | 438/109 |
| 2011/0024887 A1* | 2/2011 | Chi et al. | ...... | 257/684 |
| 2011/0024888 A1* | 2/2011 | Pagaila et al. | ...... | 257/686 |
| 2011/0133325 A1* | 6/2011 | Moon et al. | ...... | 257/686 |
| 2011/0278741 A1* | 11/2011 | Chua et al. | ...... | 257/777 |

\* cited by examiner

*Primary Examiner* — James Mitchell
(74) *Attorney, Agent, or Firm* — J.C. Patents (57) ABSTRACT

A package structure and a package process are proposed in using pillar bumps to connect an upper second chip and through silicon vias of a lower first chip, wherein a gap between the first chip and the second chip can be controlled by adjusting a height of the pillar bumps. In other words, the pillar bumps compensate the height difference between the first chip and a molding compound surrounding the first chip so as to ensure the bondibility between the pillar bumps and the corresponding through silicon vias and improve the process yield. Furthermore, the pillar bumps maintain the gap between the second chip and the molding compound for allowing an underfill being properly filled into the space between the first chip and the second chip.

7 Claims, 12 Drawing Sheets

PACKAGE PROCESS

CROSS-REFERENCE TO RELATED APPLICATION

This application claims the priority benefit of Taiwan application serial no. 99116089, filed on May 20, 2010. The entirety of the above-mentioned patent application is hereby incorporated by reference herein and made a part of specification.

BACKGROUND OF THE INVENTION

The present invention relates to a package structure and a package process, and particularly relates to a stacked package structure and fabricating process thereof.

In today's information society, users all seek after electronic products with high speed, high quality and multiple functions. In terms of the product exterior appearance, electronic product designs reveal a trend of light weight, thinness and compactness. Therefore, various semiconductor device package techniques such as stacked semiconductor device package technique are proposed.

In the stacked semiconductor device package technique, several semiconductor devices are perpendicularly stacked together to form a package structure so that the package density is improved and the dimension of the package is decreased. Furthermore, by using three-dimensional stacking method to decrease the path length of the signal transmission between the semiconductor devices, rate of the signal transmission is improved and the semiconductor devices with different functions can be combined in the same package.

A conventional stacked semiconductor device package process is proposed by disposing a chip carrier on a circuit substrate first, and then a plurality of through silicon vias (TSV) are fabricated in the chip carrier after a molding process for electrically connecting a sequentially stacked upper chip with the circuit substrate.

To a conventional fabrication method, the through silicon vias are fabricated by grinding the chip carrier and the molding compound above the chip carrier until a top surface of each of the through silicon vias is exposed. Next, a selective etching process is performed to protruding an end of each of the through silicon vias from the chip carrier. However, the height of the chip carrier goes to be lower than that of the molding compound after the selective etching process is performed. For instance, the thickness of the chip carrier and the thickness of the molding compound being almost the same before the selective etching process goes different after the selective etching process, wherein a height difference between the chip carrier and the molding compound reaches 3~5 μm or even goes beyond 5 μm. If so, the height of bumps on the upper chip may not satisfy the aforementioned height difference as bonding the upper chip to the chip carrier, such that a failure of electrical test occurs due to invalid bonding between the bumps and the through silicon vias, or the underfill can not be properly filled into a restricted space between the upper chip and the molding compound.

SUMMARY OF THE INVENTION

The present invention is directed to a package structure and a package process, wherein reliable bonding effect between an upper chip and through silicon vias of a chip carrier of a stacked semiconductor device package can be achieved to improve process yield.

The present invention is directed to a package structure and a package process, wherein a favorable gap between an upper chip and a molding compound of a stacked semiconductor device package can be effectively maintained for accomplishing a sequent molding process.

As embodied and broadly described herein, a package structure comprising a circuit substrate, a first chip, a plurality of first bumps, a first molding compound, a second chip and a plurality of pillar bumps is provided. The circuit substrate comprises a top surface and a bottom surface opposite to the top surface. The first chip is disposed on the top surface of the circuit substrate. The first chip has a top surface and a bottom surface opposite to each other, wherein the bottom surface of the first chip faces the circuit substrate, and the first chip has a plurality of through silicon vias. An end of each of the through silicon vias protrudes from the top surface of the first chip. The first bumps are disposed between the first chip and the circuit substrate and electrically connecting the through silicon vias with the circuit substrate. The first molding compound covers the entire top surface of the circuit substrate and has an opening exposing the top surface of the first chip and the end of each of the through silicon vias. The second chip is disposed above the first chip, and the second chip has a bottom surface facing the first chip. The pillar bumps are disposed on the bottom surface of the second chip and electrically connecting the second chip with the corresponding through silicon vias.

In an embodiment, the package structure further comprises a first underfill disposed between the first chip and the circuit substrate to encapsulate the first bumps.

In an embodiment, the package structure further comprises a second molding compound disposed on the first molding compound and covering the second chip.

In an embodiment, the package structure further comprises a second underfill disposed between the second chip and the first chip to encapsulate the pillar bumps and the end of each of the through silicon vias.

In an embodiment, a top surface of the first molding compound is higher than the top surface of the first chip.

In an embodiment, a top surface of the first molding compound is higher than the end of each of the through silicon vias.

In an embodiment, a top surface of the first molding compound has a height difference H1 relative to the end of each of the through silicon vias, and a height H2 of the pillar bumps is greater than the height difference H1.

A package process is also provided herein. First, a circuit substrate having a top surface is provided. Then, a plurality of first chips are bonded onto the top surface of the circuit substrate, wherein a bottom surface of each of the first chips faces the circuit substrate, each of the first chips has a plurality of first bumps on the bottom surface of the first chip and a plurality of conductive vias, and each of the first bumps electrically connects the corresponding conductive via with the circuit substrate. Next, a first molding compound is formed to cover the top surface of the circuit substrate and the first chips. Then, the first molding compound above each of the first chips is removed and the thickness of each of the first chips is reduced to expose a top surface of each of the first chips and an end of each of the conductive vias, wherein the end of each of the conductive vias protrudes from the top surface of the corresponding first chip to form a through silicon via. Thereafter, second chips are respectively bonding onto their corresponding first chips. A bottom surface of each of the second chips faces the corresponding first chip, each of the second chips has a plurality of pillar bumps on its bottom surface, and the pillar bumps electrically connect their corresponding second chip with the through silicon vias.

In an embodiment, a first underfill encapsulating the first bumps is formed between the first chips and the circuit substrate after bonding the first chips onto the top surface of the circuit substrate.

In an embodiment, the package process further comprises forming a second molding compound on the first molding compound after bonding the second chips onto their corresponding first chips. The second molding compound covers the second chips.

In an embodiment, the package process further comprises forming a second underfill between each of the second chips and the corresponding first chip after bonding the second chips onto their corresponding first chips. The second underfill encapsulates the pillar bumps and the end of each of the through silicon vias.

Another semiconductor package including a circuit substrate, a package unit and a first underfill is provided. The circuit substrate comprises a top surface and a bottom surface opposite to the top surface. The package unit is disposed on the top surface of the circuit substrate. The package unit comprises a first chip, a first molding compound, a plurality of first bumps, a second chip and a plurality of pillar bumps. The first chip has a top surface and a bottom surface opposite to each other, and the bottom surface of the first chip faces the circuit substrate. The first chip has a plurality of through silicon vias, wherein an end of each of the through silicon vias protrudes from the top surface of the first chip. The first molding compound covers the first chip, wherein a bottom surface of the first molding compound is coplanar with the bottom surface of the first chip, and the first molding compound has an opening exposing the top surface of the first chip and the end of each of the through silicon vias. The first bumps are disposed between the first chip and the circuit substrate and electrically connecting the through silicon vias with the circuit substrate. The second chip is disposed above the first chip, and the second chip has a bottom surface facing the first chip. The pillar bumps are disposed on the bottom surface of the second chip and electrically connecting the second chip with the corresponding through silicon vias.

In an embodiment, the package structure further comprises a first underfill disposed between the package unit and the circuit substrate to encapsulate the first bumps.

In an embodiment, the package structure further comprises a second molding compound disposed on the first molding compound and covering the second chip.

In an embodiment, the package structure further comprises a second underfill disposed between the second chip and the first chip to encapsulate the pillar bumps and the end of each of the through silicon vias.

In an embodiment, a top surface of the first molding compound is higher than the top surface of the first chip.

In an embodiment, a top surface of the first molding compound is higher than the end of each of the through silicon vias.

In an embodiment, a top surface of the first molding compound has a height difference H1 relative to the end of each of the through silicon vias, and a height H2 of the pillar bumps is greater than the height difference H1.

A package process is also provided herein. First, a carrier with an adhesive layer coated thereon is provided. Next, a plurality of first chips is disposed on the adhesive layer, wherein a bottom surface of each of the first chips faces the carrier. Each of the first chips has a plurality of first bumps on the bottom surface of the first chip and a plurality of conductive vias. The first bumps are embedded into the adhesive layer. Then, a first molding compound is formed on the adhesive layer to cover the adhesive layer and the first chips. Then, the first molding compound above each of the first chips is removed and the thickness of each of the first chips is reduced to expose a top surface of each of the first chips and an end of each of the conductive vias, wherein the end of each of the conductive vias protrudes from the top surface of the corresponding first chip to form a through silicon via. Thereafter, second chips are respectively bonding onto their corresponding first chips. A bottom surface of each of the second chips faces the corresponding first chip, and each of the second chips has a plurality of pillar bumps. The pillar bumps are disposed on the bottom surface of the second chip and electrically connecting the corresponding second chip with the through silicon vias. Then, the carrier and the adhesive layer are removed to form a package unit array and the package unit array are cut to obtain a plurality of package units. After that, one of the package units is bonded onto a top surface of a circuit substrate. The package unit is electrically connected to the circuit substrate through the corresponding first bumps. Then, the circuit substrate is cut.

In an embodiment, the package process further comprises forming a first underfill between the chip unit and the circuit substrate after bonding one of the package units onto the top surface of the circuit substrate. The first underfill encapsulates the first bumps.

In an embodiment, the package process further comprises forming a second molding compound on the first molding compound after bonding the second chips onto their corresponding first chips, wherein the second molding compound covers the first molding compound.

In an embodiment, the package process further comprises forming a second underfill between each of the second chips and the corresponding first chip after bonding the second chips onto their corresponding first chips. The second underfill encapsulates the pillar bumps and the end of each of the through silicon vias.

As to the above, pillar bumps are adopted in the present invention to connect an upper second chip and through silicon vias of a lower first chip so as to control a gap between the first chip and the second chip by adjusting a height of the pillar bumps. In other words, the pillar bumps of the present invention compensate the height difference between the first chip and a first molding compound surrounding the first chip so as to ensure the bondibility between the pillar bumps and the corresponding through silicon vias and thereby improve the process yield. Furthermore, the pillar bumps maintain the gap between the second chip and the first molding compound for allowing an underfill being properly filled into the space between the first chip and the second chip.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

The present invention uses pillar bumps to connect an upper second chip and a lower first chip so as to control a gap between the first chip and the second chip and overcome a height difference between the first chip and a molding compound surrounding the first chip caused by forming through silicon vias. The aforementioned concept can be applied to various stacked semiconductor device packages, and some package structures and package processes of stacked semiconductor device package are illustrated in the following embodiments.

Figure 1:
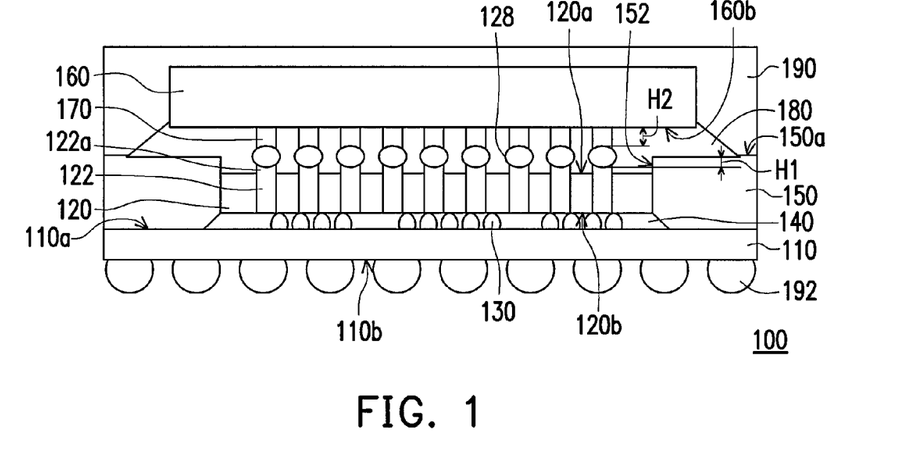
FIG. 1 illustrates a package structure according to an embodiment of the present invention.

FIG. 1 illustrates a package structure according to an embodiment of the present invention. As shown in FIG. 1, the package structure 100 of the present embodiment comprises a circuit substrate 110, a first chip 120, a plurality of first bumps 130, a first underfill 140, a first molding compound 150, a second chip 160, a plurality of pillar bumps 170 and a second underfill 180. The circuit substrate 110 has a top surface 110a and a bottom surface 110b opposite to the top surface 110a. The first chip 120 is disposed on the top surface 110a of the circuit substrate 110. In addition, a bottom surface 120b of the first chip 120 faces the circuit substrate 110, and the first chip 120 has a plurality of through silicon vias 122. An end 122a of each of the through silicon vias 122 protrudes from a top surface 120a of the first chip 120.

Referring to FIG. 1, the first bumps 130 are disposed between the first chip 120 and the circuit substrate 110 to electrically connecting the through silicon vias 122 with the circuit substrate 110. The underfill 140 is disposed between the first chip 120 and the circuit substrate 110 for encapsulating the first bumps 130. Moreover, the first molding compound 150 covers the entire top surface 110a of the circuit substrate 110 and has an opening 152 exposing the top surface 120a of the first chip 120 and the end 122a of each of the through silicon vias 122. Herein, the through silicon vias 122 are fabricated by grinding the first chip 120 and the first molding compound 150 above the first chip 120 until a top surface of each of the through silicon vias 122 is exposed. Next, a selective etching process is performed to the first chip 120 to protruding the end 122a of each of the through silicon vias 122 from the first chip 120. Herein, a top surface 150a of the first molding compound 150 may be higher than the top surface 120a of the first chip 120. Furthermore, the top surface 150a of the first molding compound 150 may also be higher than the end 122a of each of the through silicon vias 122.

The second chip 160 is disposed above the first chip 120, and a bottom surface 160b of the second chip 160 faces the first chip 120. The pillar bumps 170 are disposed on the bottom surface 160b of the second chip 160 and electrically connecting the second chip 160 with the corresponding through silicon vias 122. The pillar bumps 170 may be bonded with the corresponding through silicon vias 122 by for example a solder material 128. The second underfill 180 is disposed between the second chip 160 and the first chip 120 to encapsulate the pillar bumps 170 and the end 122a of each of the through silicon vias 122. Furthermore, the package structure 100 may comprise a second molding compound 190 disposed on the first molding compound 150 and covering the second chip 160 and the second underfill 180. The circuit substrate 110 may be provided with a plurality of solder balls 192 on its bottom surface 110b.

In the package structure 100 of the present embodiment, the top surface 150a of the first molding compound 150 may have a height difference H1 relative to the end 122a of each of the through silicon vias 122, while the height H2 of the pillar bumps 170 is greater than the height difference H1 to overcome the height difference H1 and thereby ensure an effective bonding between the pillar bumps 170 and their corresponding through silicon vias 122. A material of the pillar bumps 170 may be copper, gold, aluminum or other appropriate conductive materials.

In addition, a size of the second chip 160 is greater than that of the first chip 120. Since the height H2 of the pillar bumps 170 is greater than the height difference H1 between the top surface 150a of the first molding compound 150 and the end 122a of each of the through silicon vias 122, the second chip 160 can be kept away from the top surface 150a of the first molding compound 150 such that the second underfill 180 can be properly filled into the space between the first chip 120 and the second chip 160 and the space between the second chip 160 and the first molding compound 150. Certainly, in other embodiments of the present invention, the size of the second chip 160 may also be smaller than that of the first chip 120. The sizes of the first chip 120 and the second chip 160 are not limited in the present invention.

FIGS. 2A through 2K illustrate a method for fabricating the package structure 100 of FIG. 1. For a clear description, FIGS. 2A through 2K show only the package process of a unit in a partial region. Practically, the package process of the present embodiment may be a wafer level package process, wherein the package process is performed to a plurality of units arranged in an array on a carrier to form a plurality of package structures 100 as show in FIG. 1.

Figure 2A:
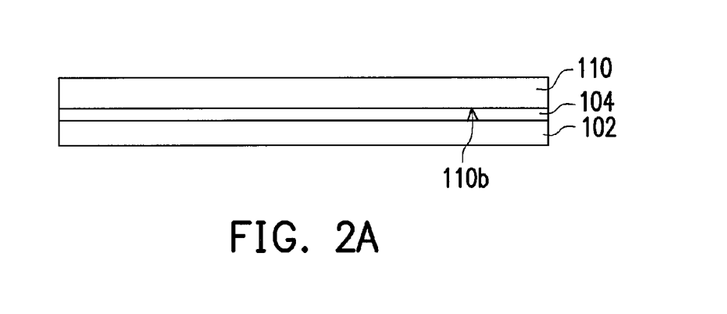
FIGS. 2A through 2K illustrate a method for fabricating the package structure of FIG. 1.
Figure 2B:
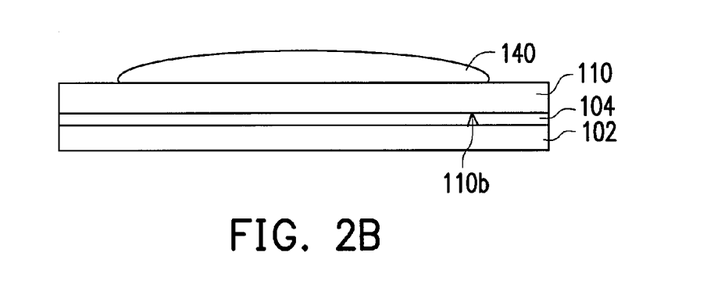
Figure 2C:
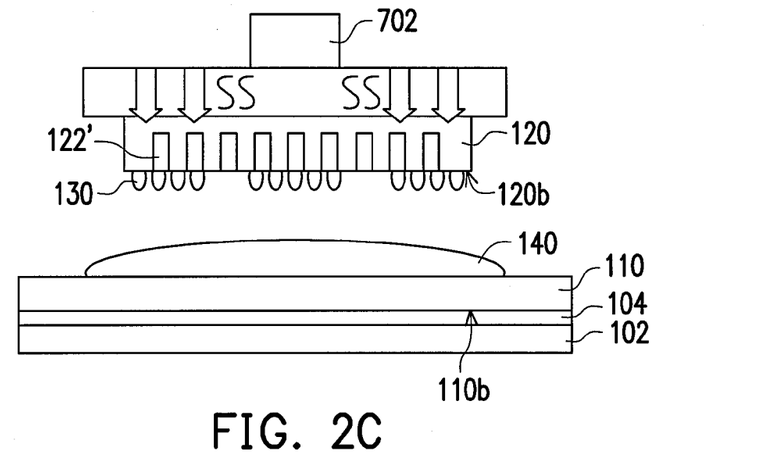

Firstly, referring to FIG. 2A, the circuit substrate 110 is disposed on a carrier 102, wherein the bottom surface 110b of the circuit substrate 110 is bonded with the carrier 102 via an adhesive layer 104. The carrier 102 may be a wafer or other applicable substrates. Next, referring to FIG. 2B, a first underfill 140 is coated on the top surface 110a of the substrate 110. The first underfill 140 may be a thermal-cured material. And, referring to FIG. 2C, a thermal pressing head 702 obtains the first chip 120 and bonds the first chip 120 to the circuit substrate 110 by flip-chip technique. The bottom surface 120b of the first chip 120 faces the circuit substrate 110. Each of the first chips 120 has a plurality of first bumps 130 on the bottom surface 120b and a plurality of conductive vias 122'.

Figure 2D:
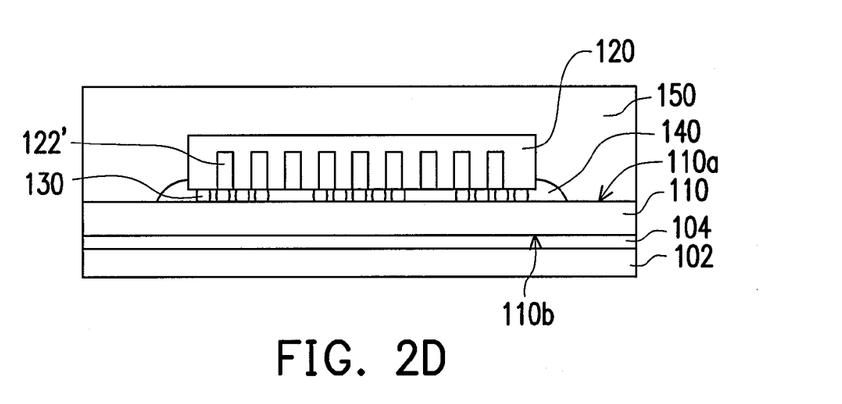
Figure 2E:
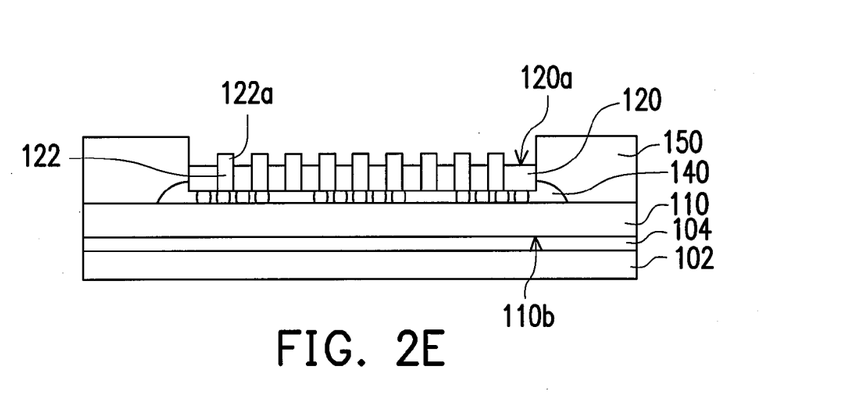

Afterwards, referring to FIG. 2D, each of the first bumps 130 is electrically connected to the corresponding conductive vias 122' and the circuit substrate 110. The first underfill 140 encapsulates the first bumps 130. And, the first molding compound 150 is formed to cover the top surface 110a of the circuit substrate 110, the first chip 120 and the first underfill 140. Then, referring to FIG. 2E, the first molding compound 150 above the first chip 120 is removed and the thickness of the first chip 120 is reduced to expose the top surface 120a of the first chip 120 and the end 122a of each of the conductive vias 122' by grinding, selective etching or other applicable processes, wherein the end 122a of each of the conductive vias 122' protrudes from the top surface 120a of the corresponding first chip 120 to form the through silicon via 122.

Figure 2F:
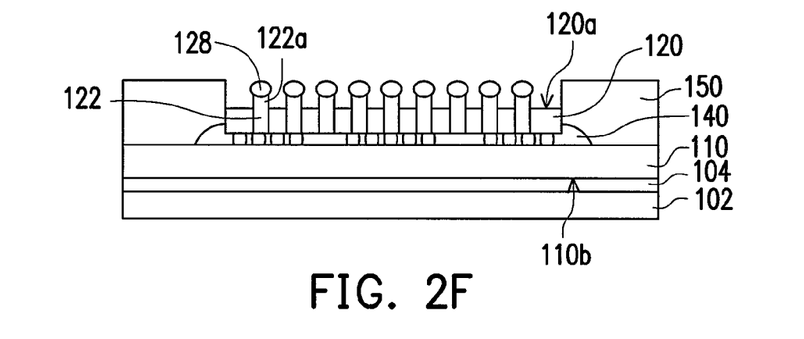
Figure 2G:
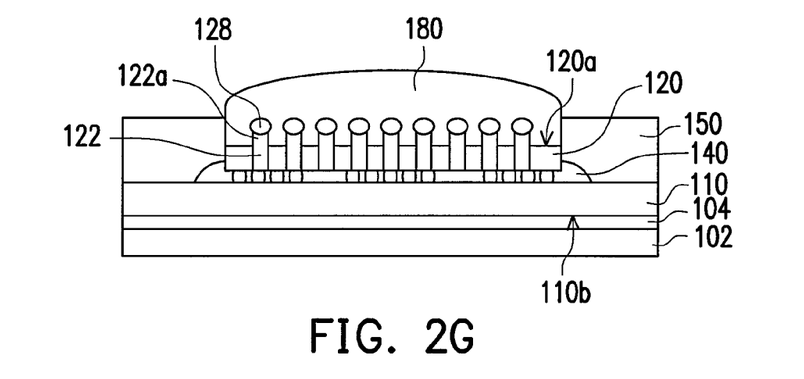
Figure 2H:
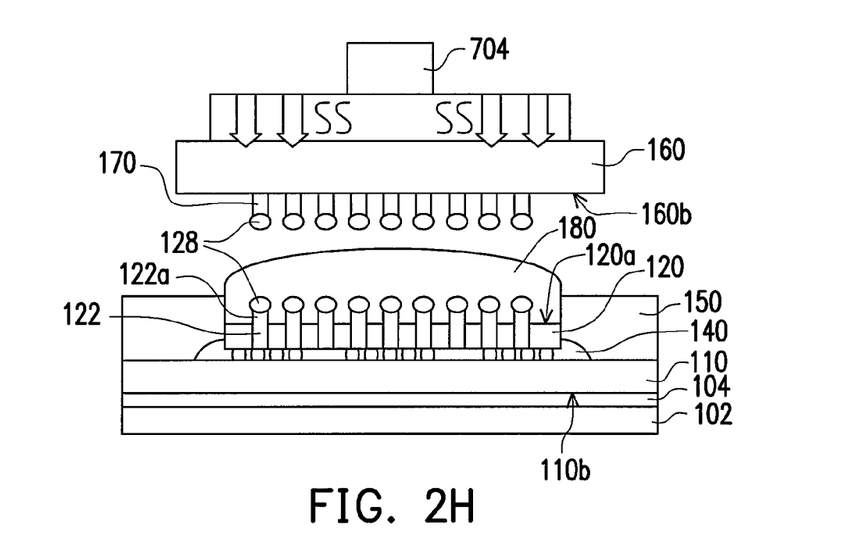

Next, referring to FIG. 2F, a surface treatment is performed to the end 122a of each of the through silicon vias 122 and a solder material 128 (or a nickel/gold stacked layer) can be formed on the end 122a, so as to improve the bondibility between the pillar bumps 170 (as shown in FIG. 2H) and the through silicon vias 122 in the sequent bonding process. Then, referring to FIG. 2G, the second underfill 180 is formed on the top surface 120a of the first chip 120. The second underfill 180 may be a thermal-cured material.

Figure 2I:
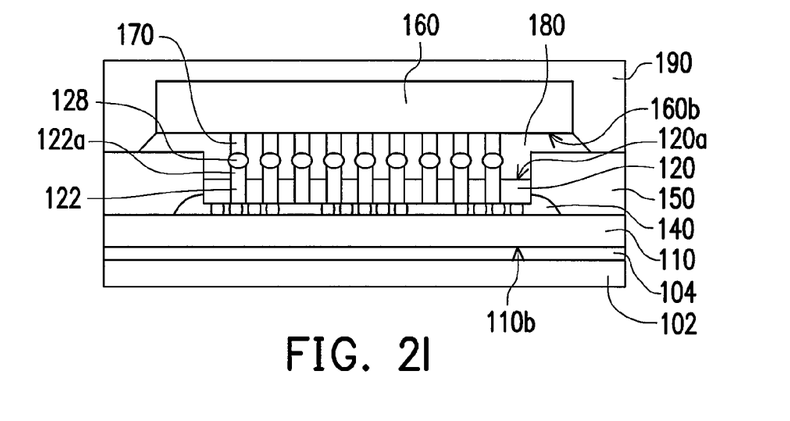

Then, referring to FIG. 2H, a thermal pressing head 704 obtains the second chip 160 and bonds the second chip 160 to the first chip 120 by flip-chip technique. The bottom surface 160b of the second chip 160 faces the first chip 120. In addition, the second chip 160 is provided with the pillar bumps 170 on its bottom surface 160b. Afterwards, referring to FIG. 2I, the pillar bumps 170 are bonded to the corresponding through silicon vias 122 through the solder material 128, so as to electrically connect the second chip 160 with the first chip 120. The second underfill 180 encapsulates the pillar bumps 170 and the end 122a of each of the through silicon vias 122. Furthermore, the present embodiment may form the second molding compound 190 on the first molding compound 150 as shown in FIG. 2I after accomplishing the step of FIG. 2H. The second molding compound 190 covers the second chip 160 and the second underfill 180.

However, in another embodiment, the second underfill 190 need not be formed.

Figure 2J:
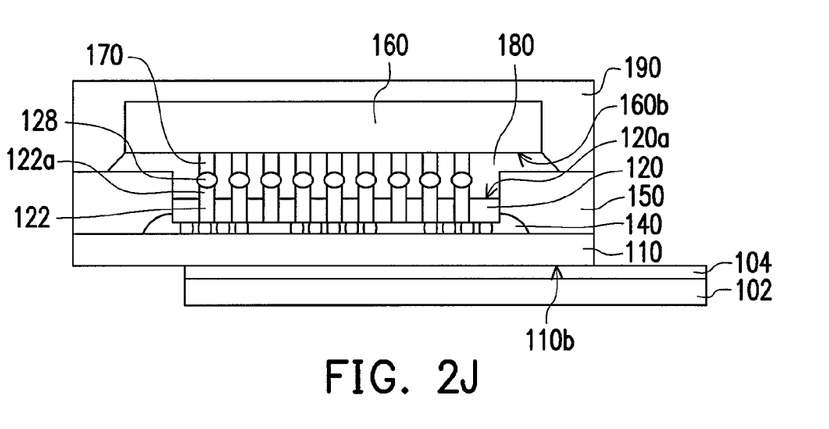
Figure 2K:
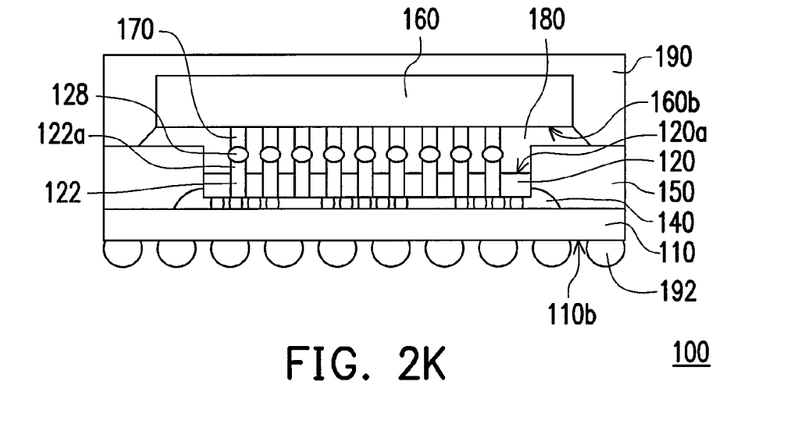

After the above steps, the circuit substrate 110 and the carrier 102 can be separated from each other as shown in FIG. 2J. And, referring to FIG. 2K, a plurality of solder balls 192 may be formed on the bottom surface 110b of the circuit substrate 110, and then the package structure in array profile can be singulated to obtain a plurality of package structures 100 as show in FIG. 1. As to the above, lateral surfaces of the substrate 110, the first molding compound 150 and the second molding compound 190 are coplanar with one another.

FIGS. 2A to 2K illustrate the package process forming the first underfill 140 before bonding the first chip 120 with the circuit substrate 110 by flip-chip technique. In addition, the second underfill 180 is formed before bonding the second chip 160 with the first chip 120.

Nevertheless, the present invention should not be construed as limited to the aforementioned embodiments.

Figure 3A:
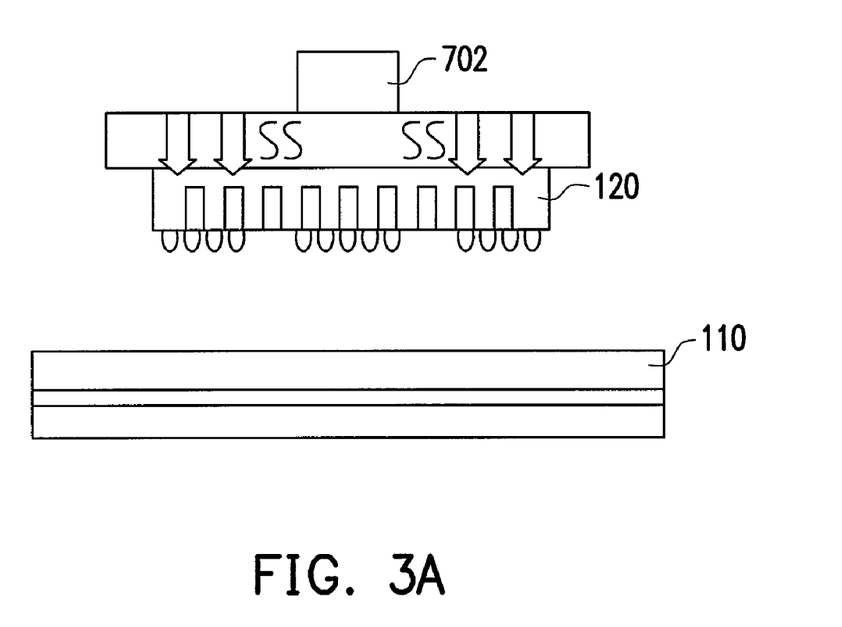
FIGS. 3A and 3B illustrate a part of packaging process of the package structure of FIG. 1 according to another embodiment of the present invention.
Figure 3B:
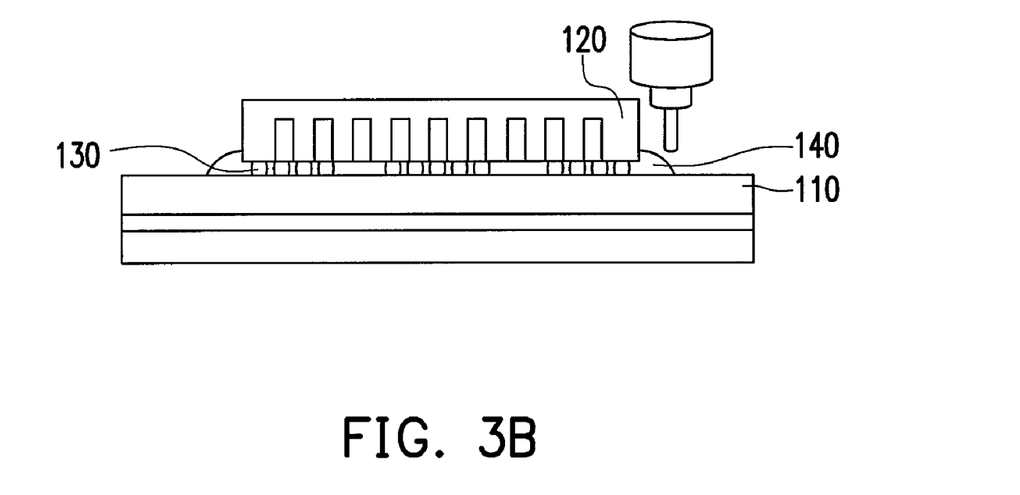

FIGS. 3A and 3B illustrate a part of packaging process of the package structure of FIG. 1 according to another embodiment of the present invention. Following the step illustrated in FIG. 2A, the process of FIG. 3A is proposed by bonding the first chip 120 to the circuit substrate 110 by flip-chip technique first. Then, as shown in FIG. 3B, the first underfill 140 is filled between the first chip 120 and the circuit substrate 110 to encapsulate the first bumps 130. After the step of FIG. 3B, the step of FIG. 2D as illustrated above can be performed.

Figure 4A:
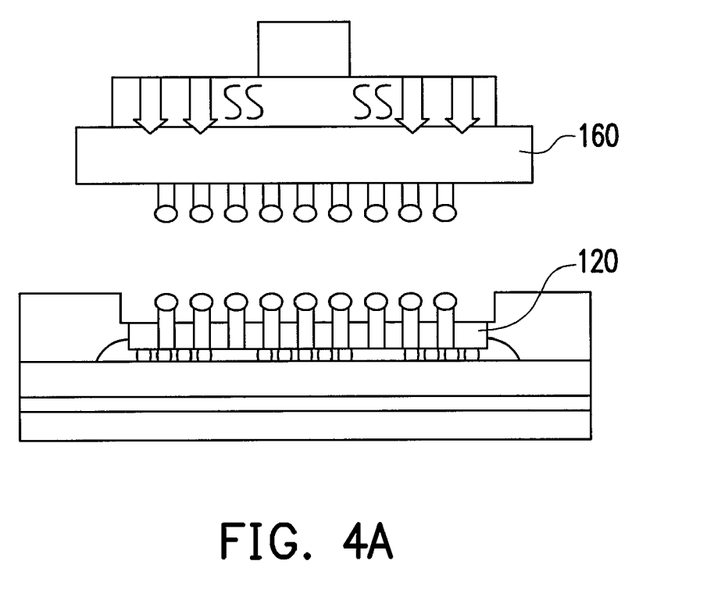
FIGS. 4A and 4B illustrate a part of packaging process of the package structure of FIG. 1 according to further another embodiment of the present invention.
Figure 4B:
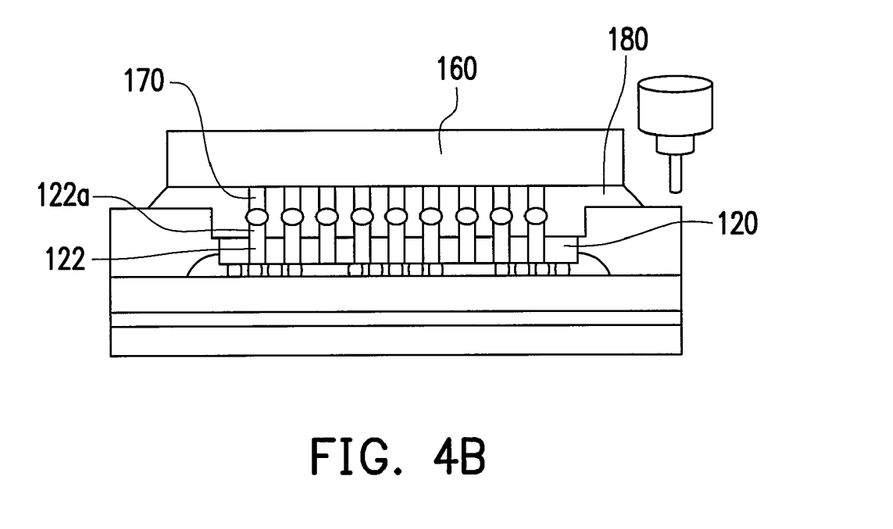

FIGS. 4A and 4B illustrate a part of packaging process of the package structure of FIG. 1 according to further another embodiment of the present invention. Following the step illustrated in FIG. 2F, the process of FIG. 4A is proposed by bonding the second chip 160 with the first chip 160 by flip-chip technique first. Then, as shown in FIG. 4B, the second underfill 180 is filled between the second chip 160 and the first chip 120 to encapsulate the pillar bumps 170 and the end 122a of each of the through silicon vias 122. After the step of FIG. 4B, the step of FIG. 2I as illustrated above can be performed.

Figure 5:
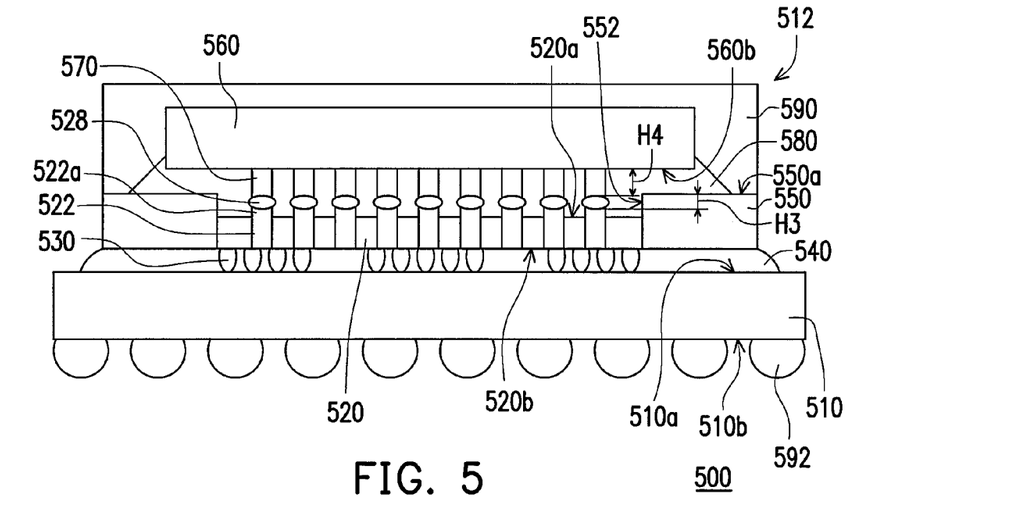
FIG. 5 illustrates a package structure according to another embodiment of the present invention.

FIG. 5 illustrates a package structure according to another embodiment of the present invention. As shown in FIG. 5, a semiconductor package 500 comprises a circuit substrate 510, a package unit 512 and a first underfill 540 is provided. The circuit substrate 510 has a top surface 510a and a bottom surface 510b opposite to the top surface 510a. The package unit 512 is disposed on the top surface 510a of the circuit substrate 510. The package unit 512 comprises a first chip 520, a first molding compound 550, a plurality of first bumps 530, a second chip 560, a plurality of pillar bumps 570 and a second underfill 580. The first chip 520 has a top surface 520a and a bottom surface 520b opposite to each other, and the bottom surface 520b of the first chip 520 faces the circuit substrate 510.

The first chip 520 has a plurality of through silicon vias 522. An end 522a of each of the through silicon vias 522 protrudes from the top surface 520a of the first chip 520. The first molding compound 550 encapsulates the first chip 520. A bottom surface 550b of the first molding compound 550 is coplanar with the bottom surface 520b of the first chip 520, and the first molding compound 550 has an opening 552 exposing the top surface 520a of the first chip 520 and the end 522a of each of the through silicon vias 522. The first bumps 530 are disposed between the first chip 520 and the circuit substrate 510 and electrically connecting the through silicon vias 522 with the circuit substrate 510.

Herein, the through silicon vias 522 are fabricated by grinding the first chip 520 and the first molding compound 550 above the first chip 120 until a top surface of each of the through silicon vias 522 is exposed. Then, a selective etching process is performed to the first chip 520 to protruding the end 522a of each of the through silicon vias 522 from the first chip 520. Thus, the top surface 550a of the first molding compound 550 may be higher than the top surface 520a of the first chip 520. Furthermore, the top surface 550a of the first molding compound 550 may also be higher than the end 522a of each of the through silicon vias 522.

The second chip 560 is disposed above the first chip 520. The bottom surface 560b of the second chip 560 faces the first chip 520. The pillar bumps 570 are disposed on the bottom surface 560b of the second chip 560 and electrically connecting the second chip 560 with the corresponding through silicon vias 522. The pillar bumps 570 may be bonded with the corresponding through silicon vias 522 by for example a solder material 528. The second underfill 580 is disposed between the second chip 560 and the first chip 520 to encapsulate the pillar bumps 570 and the end 522a of each of the through silicon vias 522. The underfill 540 is disposed between the package unit 512 and the circuit substrate 510 to encapsulate the first bumps 530. Furthermore, the package structure 500 may comprise a second molding compound 590 disposed on the first molding compound 550 and covering the second chip 560 and the second underfill 580. The circuit substrate 510 may be provided with a plurality of solder balls 592 on its bottom surface 510b.

In the package structure 500 of the present embodiment, the top surface 550a of the first molding compound 550 may have a height difference H3 relative to the end 522a of each of the through silicon vias 522, while the height H4 of the pillar bumps 570 is greater than the height difference H3 to overcome the height difference H3 and thereby ensure an effective bonding between the pillar bumps 570 and their corresponding through silicon vias 522.

In addition, a size of the second chip 560 is greater than that of the first chip 520. Since the height H4 of the pillar bumps 570 is greater than the height difference H3 between the top surface 550a of the first molding compound 550 and the end 522a of each of the through silicon vias 522, the second chip 560 can be kept away from the top surface 550a of the first molding compound 550 such that the second underfill 580 can be properly filled into the space between the first chip 520 and the second chip 560 and the space between the second chip 560 and the first molding compound 550. Certainly, in other embodiments of the present invention, the size of the second chip 560 may also be smaller than that of the first chip 520. The sizes of the first chip 520 and the second chip 560 are not limited in the present invention.

FIGS. 6A through 6J illustrate a method for fabricating the package structure 500 of FIG. 5. For a clear description, FIGS. 6A through 6J show only the package process of a unit in a partial region. Practically, the package process of the present embodiment may be a wafer level package process, wherein the package process is performed to a plurality of units arranged in an array on a carrier to form a plurality of package structures 500 as show in FIG. 5.

Figure 6A:
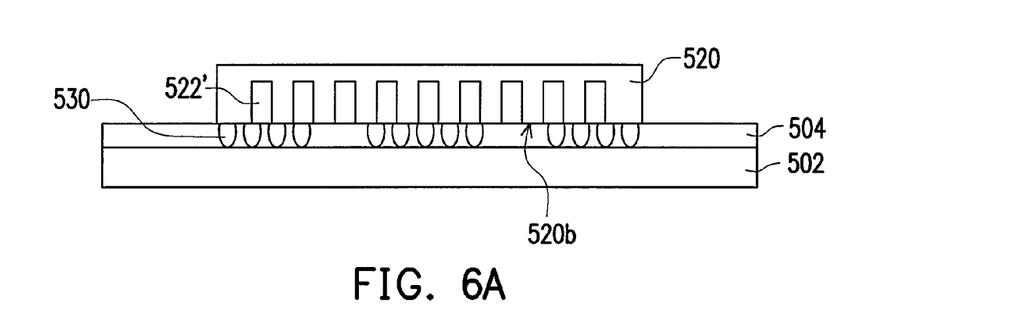
FIGS. 6A through 6J illustrate a method for fabricating the package structure of FIG. 5.

First, referring to FIG. 6A, a carrier 502 with an adhesive layer 504 coated thereon is provided. Next, the first chip 520 is disposed on the adhesive layer 504. The bottom surface 520b of the first chip 520 faces the carrier 502. The first chip 520 has a plurality of first bumps 530 on the bottom surface 520b and a plurality of conductive vias 522', wherein the first bumps 530 are embedded into the adhesive layer 504.

Figure 6B:
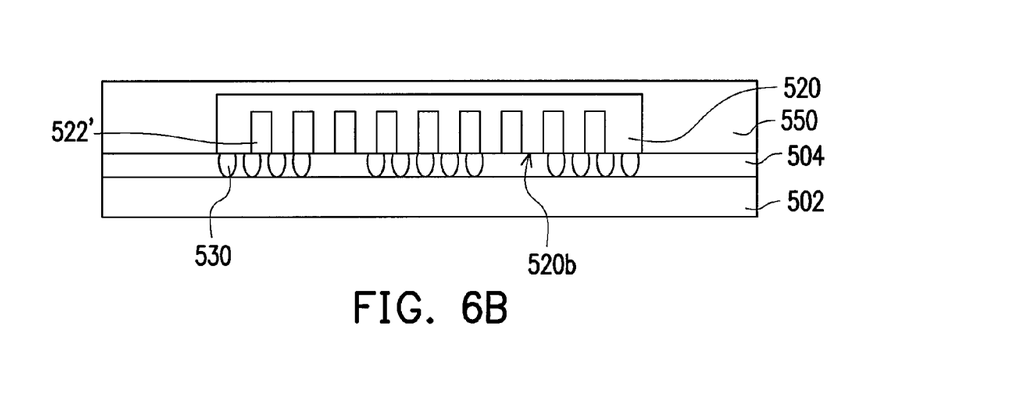
Figure 6C:
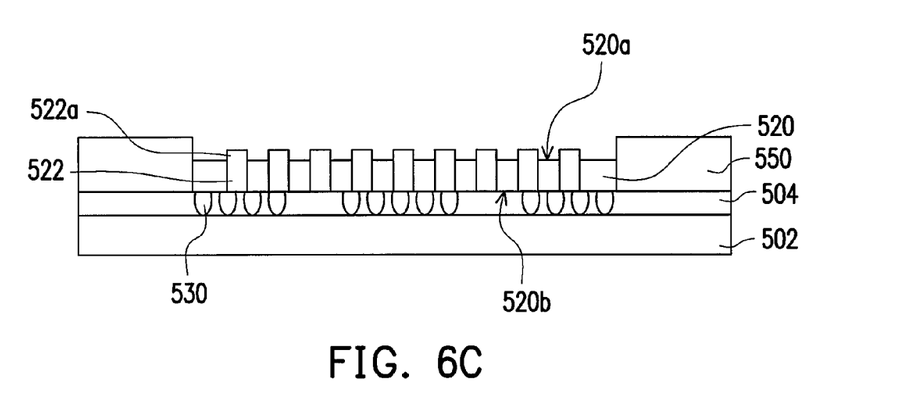

Then, referring to FIG. 6B, a first molding compound 550 is formed on the adhesive layer 504 to cover the adhesive layer 504 and the first chip 520. Next, referring to FIG. 6C, the first molding compound 550 above the first chip 520 is removed and the thickness of the first chip 520 is reduced to expose the top surface 520a of the first chip 520 and the end 522a of each of the conductive vias 522', wherein the end 522a of each of the conductive vias 522' protrudes from the top surface 520a of the corresponding first chip 520 to form the through silicon via 522.

Figure 6D:
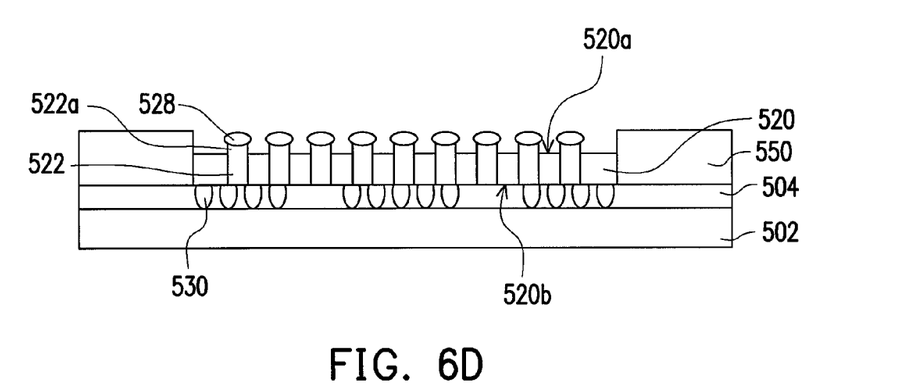
Figure 6E:
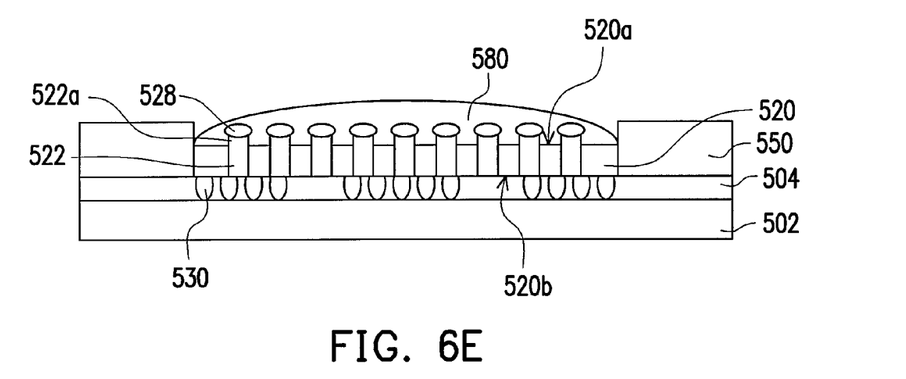
Figure 6F:
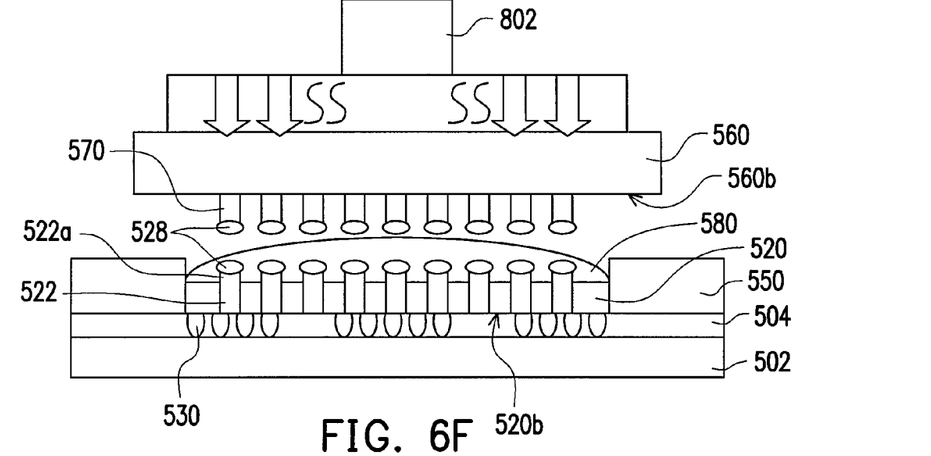

Then, referring to FIG. 6D, a surface treatment is performed to the end 522a of each of the through silicon vias 522 and a solder material 528 (or a nickel/gold stacked layer) can be formed on the end 522a, so as to improve the bondibility between the pillar bumps 570 (as shown in FIG. 6F) and the through silicon vias 522 in the sequent bonding process. Afterwards, referring to FIG. 6E, the second underfill 580 is formed on the top surface 520a of the first chip 520. The second underfill 580 may be a thermal-cured material.

Figure 6G:
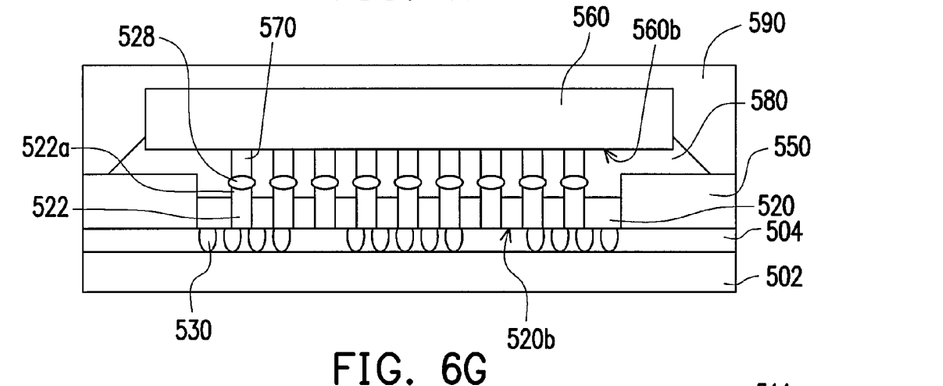
Figure 6H:
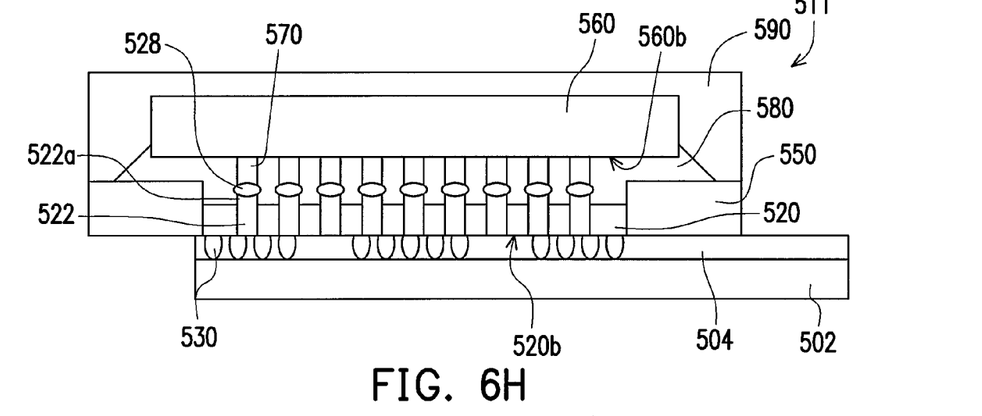

Then, referring to FIG. 6F, a thermal pressing head 802 obtains the second chip 560 and bonds the second chip 560 to the first chip 520 by flip-chip technique. The bottom surface 560b of the second chip 560 faces the first chip 520. In addition, the second chip 560 is provided with the pillar bumps 570 on its bottom surface 560b. Next, referring to FIG. 6G, the pillar bumps 570 are bonded to the corresponding through silicon vias 522 through the solder material 528, so as to electrically connect the second chip 560 with the first chip 520. The second underfill 580 encapsulates the pillar bumps 570 and the end 522a of each of the through silicon vias 522. Furthermore, the present embodiment may form the second molding compound 590 on the first molding compound 550 as shown in FIG. 6G after accomplishing the step of FIG. 6F. The second molding compound 590 covers the second chip 560 and the second underfill 580.

However, in another embodiment, the second underfill 590 need not be formed.

After the above steps, the carrier 502 and the adhesive layer 504 can further be removed to form a package unit array 511. And, the first bumps 530 previously embedded into the adhesive layer 504 are now exposed. Then, the package unit array 511 is cut to obtain a plurality of package unit 512 as shown in FIG. 6J.

Figure 6I:
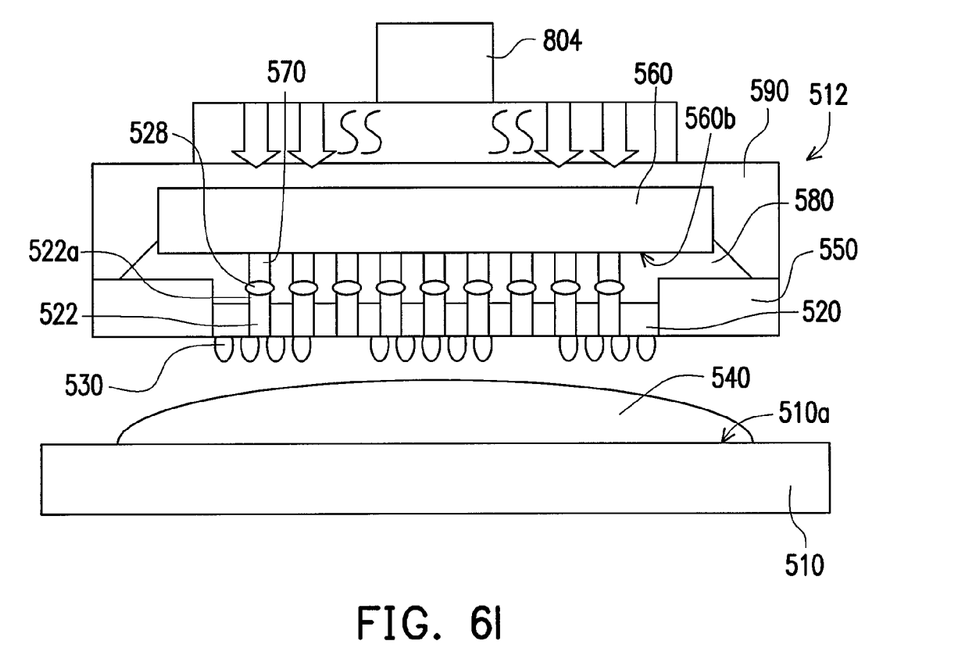
Figure 6J:
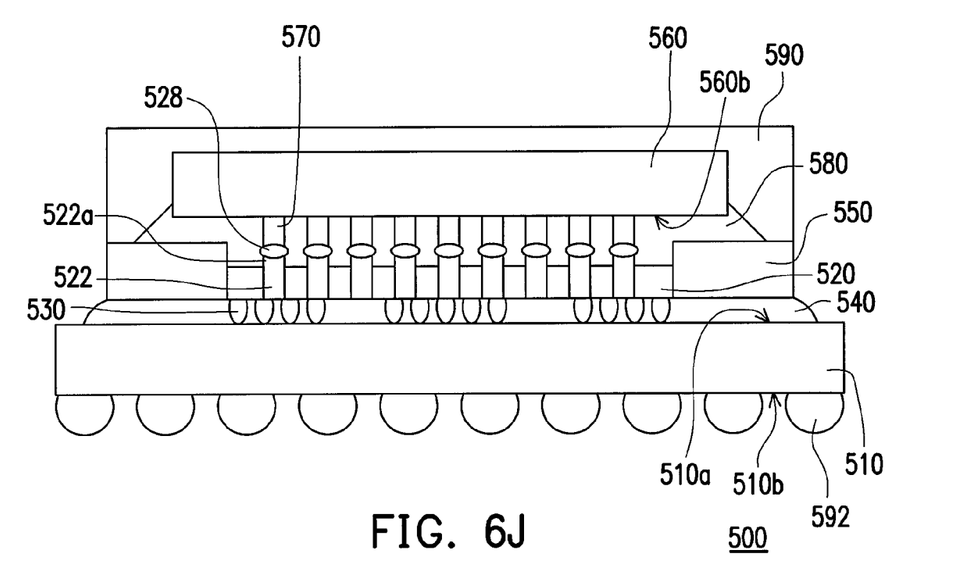

Next, referring to both FIGS. 6I and 6J, a first underfill 540 is coated on the top surface 510a of the substrate 510. The first underfill 540 may be a thermal-cured material. And, a thermal pressing head 804 obtains the package unit 512 and bonds the package unit 512 to the circuit substrate 510 by flip-chip technique.

The bottom surface 520b of the first chip 520 faces the circuit substrate 510. The package unit 512 is electrically connected to circuit substrate 510 through the first bumps 530 on the bottom surface 520b of the first chip 520, and the first underfill 540 encapsulates the first bumps 530. A plurality of solder balls 592 may be formed on the bottom surface 510b of the circuit substrate 510, and then the package structure in array profile can be singulated to obtain a plurality of package structures 500 as show in FIG. 5.

FIGS. 6A to 6J illustrate the package process filling the second underfill 580 between the first chip 520 and the second chip 560 before bonding the second chip 560 with the first chip 520 by flip-chip technique. In addition, the first underfill 540 is filled between the package unit 512 and the circuit substrate 510 before bonding the package unit 512 with the circuit substrate 510 by flip-chip technique.

Nevertheless, the present invention should not be construed as limited to the aforementioned embodiments.

Figure 7A:
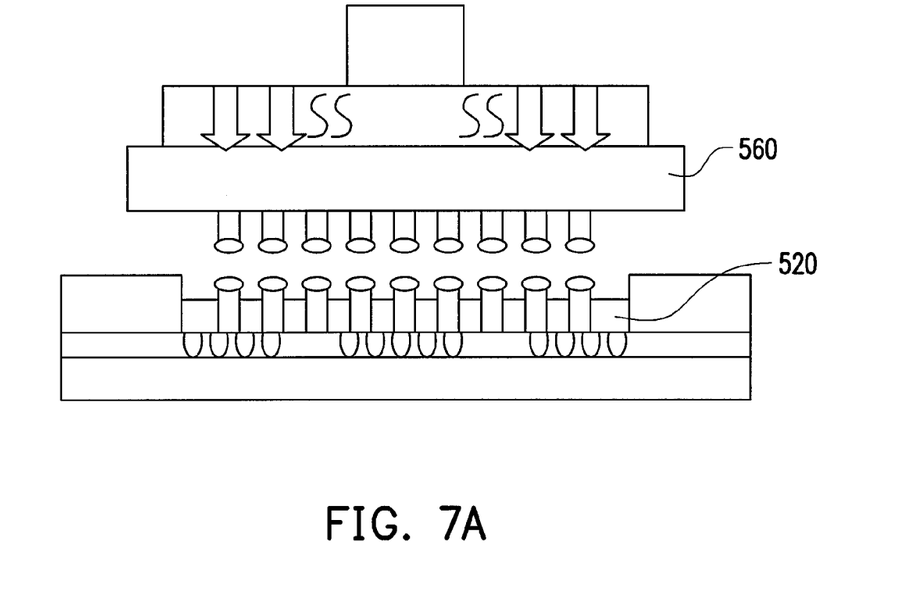
FIGS. 7A and 7B illustrate a part of packaging process of the package structure of FIG. 5 according to another embodiment of the present invention.
Figure 7B:
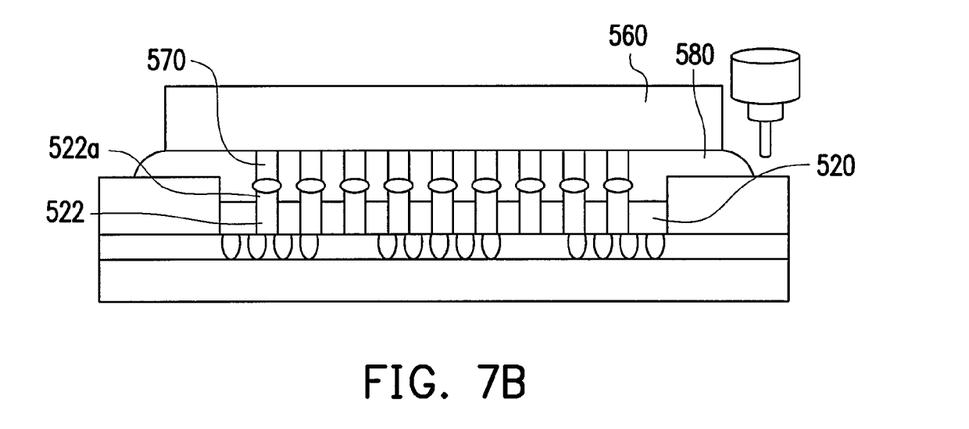

FIGS. 7A and 7B illustrate a part of packaging process of the package structure of FIG. 5 according to another embodiment of the present invention. Following the step illustrated in FIG. 6D, the process of FIG. 7A is proposed by bonding the second chip 560 with the first chip 520 by flip-chip technique first. Then, as shown in FIG. 7B, the second underfill 580 is filled between the second chip 560 and the first chip 520 to encapsulate the pillar bumps 570 and the end 522a of each of the through silicon vias 522. After the step of FIG. 7B, the step of FIG. 6G as illustrated above can be performed.

Figure 8A:
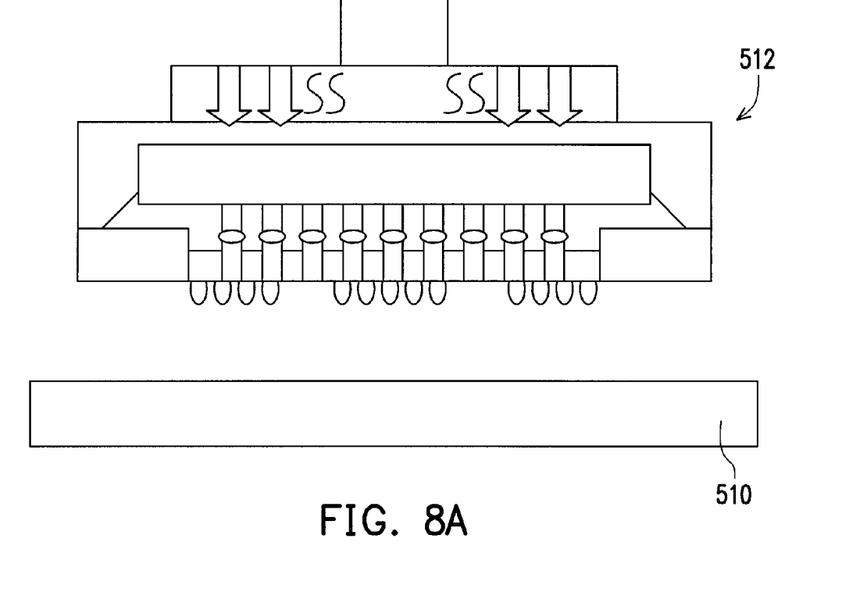
FIGS. 8A and 8B illustrate a part of packaging process of the package structure of FIG. 5 according to further another embodiment of the present invention.
Figure 8B:
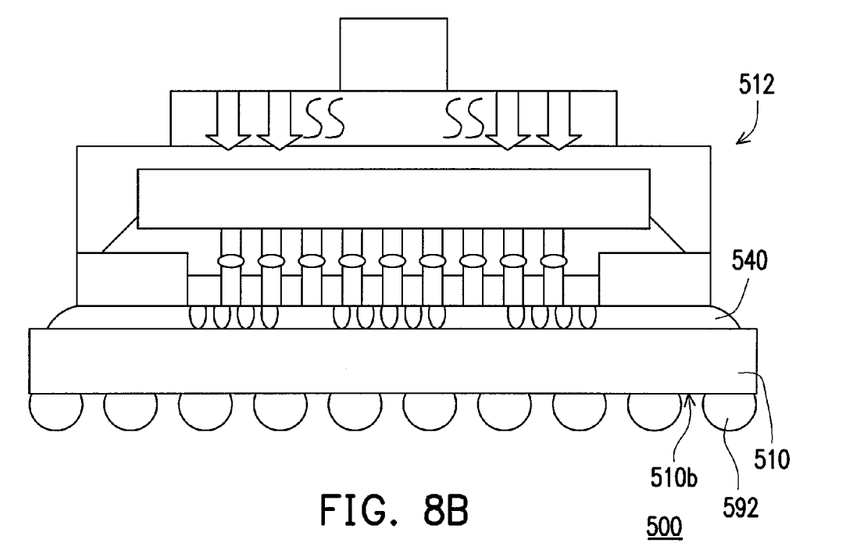

FIGS. 8A and 8B illustrate a part of packaging process of the package structure of FIG. 5 according to further another embodiment of the present invention. Following the step illustrated in FIG. 6H, the process of FIG. 8A is proposed by bonding the package unit 512 to the circuit substrate 510 by flip-chip technique first. Then, as shown in FIG. 8B, the first underfill 540 is filled between the package unit 512 and the circuit substrate 510 to encapsulate the first bumps 530. In addition, a plurality of solder balls 592 may be formed on the bottom surface 510b of the circuit substrate 510, and then the package structure in array profile can be singulated to obtain a plurality of package structures 500 as show in FIG. 5.

Therefore, the present invention provides no limitation in whether forming the underfill or performing the flip-chip bonding first, and the sizes of the upper second chip and the lower first chip are not restricted. The pillar bumps are adopted to connect the upper second chip and the through silicon vias of the lower first chip so as to control a gap between the first chip and the second chip by adjusting the height of the pillar bumps and thereby overcome the height difference between the first chip and the first molding compound surrounding the first chip. The second chip can be reliably and effectively bonded with the through silicon vias of the first chip in the stacked semiconductor device package, and the process yield is improved. Furthermore, the pillar bumps maintain the gap between the upper second chip and the first molding compound for allowing an underfill being properly filled into the space between the first chip and the second chip.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A package process, comprising: providing a circuit substrate, the circuit substrate having a top surface; bonding a plurality of first chips onto the top surface of the circuit substrate, wherein a bottom surface of each of the first chips faces the circuit substrate, each of the first chips has a plurality of first bumps on the bottom surface of the first chip and a plurality of conductive vias, and each of the first bumps electrically connects the corresponding conductive via with the circuit substrate; forming a first molding compound to cover the top surface of the circuit substrate and the first chips; removing the first molding compound above each of the first chips and reducing the thickness of each of the first chips to expose a top surface of each of the first chips and an end of each of the conductive vias, wherein the end of each of the conductive vias protrudes from the top surface of the corresponding first chip to form a through silicon via; and respectively bonding a second chip onto each of the first chips, wherein a bottom surface of each of the second chips faces the corresponding first chip, each of the second chips has a plurality of pillar bumps on its bottom surface, and the pillar bumps electrically connect their corresponding second chip with the through silicon vias.

2. The package process according to claim 1, further comprising:
   forming a second molding compound on the first molding compound to cover the second chips after bonding the second chips onto their corresponding first chips.

3. The package process according to claim 1, further comprising: forming a second underfill between each of the second chips and the corresponding first chip after bonding the second chips onto their corresponding first chips, wherein the second underfill encapsulates the pillar bumps and the end of each of the through silicon vias.

4. A package process, comprising: providing a carrier with an adhesive layer coated thereon; disposing a plurality of first chips on the adhesive layer, wherein a bottom surface of each of the first chips faces the carrier, each of the first chips has a plurality of first bumps on the bottom surface of the first chip and a plurality of conductive vias, and the first bumps are embedded into the adhesive layer; forming a first molding compound on the adhesive layer to cover the adhesive layer and the first chips; removing the first molding compound above each of the first chips and reducing the thickness of each of the first chips to expose a top surface of each of the first chips and an end of each of the conductive vias, wherein the end of each of the conductive vias protrudes from the top surface of the corresponding first chip to form a through silicon via; respectively bonding a second chip onto each of the first chips, wherein a bottom surface of each of the second chips faces the corresponding first chip, each of the second chips has a plurality of pillar bumps on its bottom surface, and the pillar bumps electrically connect their corresponding second chip with the through silicon vias; removing the carrier and the adhesive layer to form a package unit array and cutting the package unit array to obtain a plurality of package units; bonding one of the package units onto a top surface of a circuit substrate, wherein the package unit is electrically connected to the circuit substrate through the corresponding first bumps; and cutting the circuit substrate.

5. The package process according to claim 4, further comprising: forming a first underfill encapsulating the first bumps between the chip unit and the circuit substrate after bonding one of the package units onto the top surface of the circuit substrate.

6. The package process according to claim 4, further comprising:
   forming a second molding compound on the first molding compound to cover the second chips after bonding the second chips onto their corresponding first chips.

7. The package process according to claim 4, further comprising: forming a second underfill between each of the second chips and the corresponding first chip after bonding the second chips onto their corresponding first chips, wherein the second underfill encapsulates the pillar bumps and the end of each of the through silicon vias.

* * * * *